(12) United States Patent
Cooke et al.

(10) Patent No.: US 7,700,423 B2
(45) Date of Patent: Apr. 20, 2010

(54) PROCESS FOR MANUFACTURING EPITAXIAL WAFERS FOR INTEGRATED DEVICES ON A COMMON COMPOUND SEMICONDUCTOR III-V WAFER

(75) Inventors: Paul Cooke, Port Monmouth, NJ (US); Richard W. Hoffman, Jr., Clinton, NJ (US); Victor Labyuk, Hackettstown, NJ (US); Sherry Qianwen Ye, Bridgewater, NJ (US)

(73) Assignee: IQE RF, LLC, Somerset, NJ (US)

( * ) Notice: Subject to any disclaimer, the term of this patent is extended or adjusted under 35 U.S.C. 154(b) by 913 days.

(21) Appl. No.: 11/495,811

(22) Filed: Jul. 28, 2006

(65) Prior Publication Data

US 2008/0023725 A1 Jan. 31, 2008

(51) Int. Cl.
*H01L 21/00* (2006.01)

(52) U.S. Cl. .................... 438/189; 438/191; 438/195; 438/202; 438/216; 438/483; 257/E21.121; 257/E21.127; 257/E21.371; 257/E21.696; 257/E27.012; 257/E27.015; 257/E27.026; 257/E29.041; 257/E29.116; 257/E33.003

(58) Field of Classification Search ......... 438/189–216, 438/253, 483–486; 257/E21.121–127, 371, 257/696, E21.012, 15, 26, E29.041, 116, 257/144, 189, 249, 315, E33.003
See application file for complete search history.

(56) References Cited

U.S. PATENT DOCUMENTS

| | | | | |
|---|---|---|---|---|
| 4,962,050 | A | | 10/1990 | Geissberger |
| 5,012,318 | A | | 4/1991 | Honjo |
| 5,068,756 | A | * | 11/1991 | Morris et al. ............... 257/192 |
| 5,166,083 | A | * | 11/1992 | Bayraktaroglu ............. 438/170 |
| 5,243,207 | A | | 9/1993 | Plumton et al. |
| 5,250,826 | A | * | 10/1993 | Chang et al. ................ 257/273 |
| 5,665,658 | A | * | 9/1997 | Passlack ...................... 438/763 |
| 5,818,078 | A | * | 10/1998 | Makiyama et al. .......... 257/281 |
| 6,037,242 | A | * | 3/2000 | Hayafuji et al. ............. 438/483 |
| 6,258,680 | B1 | | 7/2001 | Fulford |
| 6,272,162 | B1 | * | 8/2001 | Geels et al. ............... 372/46.01 |
| 6,392,257 | B1 | * | 5/2002 | Ramdani et al. ............ 257/190 |
| 6,472,694 | B1 | * | 10/2002 | Wilson et al. ............... 257/189 |
| 6,683,360 | B1 | | 1/2004 | Dierickx |
| 6,709,989 | B2 | * | 3/2004 | Ramdani et al. ............ 438/763 |
| 6,829,270 | B2 | * | 12/2004 | Suzuki et al. ............ 372/43.01 |
| 6,881,976 | B1 | * | 4/2005 | Zheng et al. ................. 257/69 |
| 7,015,519 | B2 | | 3/2006 | Krutko et al. |
| 7,045,815 | B2 | * | 5/2006 | Yu et al. ....................... 257/43 |

(Continued)

FOREIGN PATENT DOCUMENTS

JP 61-101490 5/1986

OTHER PUBLICATIONS

USPTO Office Action in U.S. Appl. No. 11/494,969 (Aug. 18, 2009).

*Primary Examiner*—Michael S Lebentritt
(74) *Attorney, Agent, or Firm*—Fish & Richardson P.C.

(57) ABSTRACT

A method of fabricating an epitaxial compound semiconductor III-V wafer suitable for the subsequent fabrication of at least two different types of integrated active devices (such as an HBT and a FET) on such wafer by providing a substrate; growing a first epitaxial structure on the substrate; and growing a second epitaxial structure on the first epitaxial structure.

13 Claims, 7 Drawing Sheets

U.S. PATENT DOCUMENTS

| | | |
|---|---|---|
| 7,485,512 B2 | 2/2009 | Harris |
| 7,576,372 B2 * | 8/2009 | Maruska et al. ............. 257/190 |
| 2005/0184310 A1 | 8/2005 | Krutko et al. |
| 2006/0113566 A1 | 6/2006 | Krutko et al. |
| 2006/0156970 A1 | 7/2006 | Dong-Suk |
| 2008/0023725 A1 | 1/2008 | Cooke et al. |

* cited by examiner

HBT/MESFET Epitaxial Layer Sequence

| | | Nominal Thickness (Å) | Mole Fraction | Carrier Concentration (per cm³) |
|---|---|---|---|---|
| InGaAs:Te | Contact | 500 | In=0.60 | >1.0e19 |
| (In)GaAs:Te | Contact | 500 | Graded, In=0–>0.60 | >1.0e19 |
| GaAs:Si | Contact | 1000 | n/a | 4.0e18 |
| InGaP:Si | Emitter | 500 | In=0.49 | 5.0e17 |
| GaAs:C | Base | 1000 | n/a | 4.0e19 |
| GaAs:Si | Collector | 10000 | n/a | 1.0e16 |
| GaAs:Si | Subcollector | 5000 | n/a | 5.0e18 |
| InGaP:Si | Etch Stop | 100 | In=0.49 | 5.0e18 |
| GaAs:Si | MESFET | 1000 | n/a | 5.0e17 |
| AlGaAs:undoped | BUFFER 2 | 2000 | Al=0.25 | n/a |
| GaAs:undoped | BUFFER 1 | 500 | n/a | n/a |
| Substrate (semi-insulating) | | | | |

FIG.1

HBT/PHEMT Epitaxial Layer Sequence

| | | Nominal Thickness (Å) | Mole Fraction | Carrier Concentration (per cm3) |
|---|---|---|---|---|
| InGaAs:Te | Contact | 500 | In=0.60 | >1.0e19 |
| (In)GaAs:Te | Contact | 500 | Graded In=0->0.60 | >1.0e19 |
| GaAs:Si | Contact | 1000 | n/a | 4.0e18 |
| InGaP:Si | Emitter | 500 | In=0.49 | 5.0e17 |
| GaAs:C | Base | 1000 | n/a | 4.0e19 |
| GaAs:Si | Collector | 10000 | n/a | 1.0e16 |
| GaAs:Si | Subcollector | 5000 | n/a | 5.0e18 |
| InGaP:Si | Etch Stop | 200 | In=0.49 | 5.0e18 |
| AlGaAs:Si | Barrier | 300 | Al=0.25 | 3.0e17 |
| Si Delta Doping | | n/a | n/a | 5e12/cm2 |
| AlGaAs:undoped | Spacer | 50 | Al=0.25 | n/a |
| InGaAs:undoped | Channel | 130 | In=0.20 | n/a |
| AlGaAs:undoped | Spacer | 50 | Al=0.25 | n/a |
| Si Delta Doping | | n/a | n/a | 1e12/cm2 |
| AlGaAs:undoped | Buffer 2 | 2000 | Al=0.25 | n/a |
| GaAs:undoped | Buffer 1 | 500 | n/a | n/a |
| Substrate (semi-insulating) | | | | |

FIG.5

PROCESS FOR MANUFACTURING EPITAXIAL WAFERS FOR INTEGRATED DEVICES ON A COMMON COMPOUND SEMICONDUCTOR III-V WAFER

BACKGROUND

The integration of heterojunction bipolar transistors (HBTs) or bipolar junction transistors (BJTs) and field effect transistors (FETs) on a single silicon substrate is known in the art of BiCMOS. The integration of HBTs and FETs on a single chip has significantly reduced the size and cost of many electronic devices in use today. Silicon-based HBTs/BJTs and FETs, however, are known to have certain performance limitations that make them unattractive for some high-frequency analog applications, such as high efficiency cell phone amplifiers and ICs as employed in current wireless communication applications.

The fabrication of HBTs on GaAs and other III-V compound semiconductor substrates is also known and is attractive for both performance, reliability and suitability for wireless applications. Integration of HBTs and FETs would enable higher levels of integration and would provide improvements in overall integrated circuit performance. However, few practical ways of integrating both HBTs and FETs onto a single GaAs substrate are known in the art.

One previously described method involved the growth of both HBT and FET structures on a substrate by selective MBE growth. However, this approach provided inconsistent results because of epitaxial (epi) growth interruption and epi re-growth.

Another previously described method provided a combination of HBTs and FETs on a substrate by using the emitter cap layer of an HBT as a FET channel. However, the method caused an unacceptably high emitter resistance of the HBT and parasitic effects associated with the base layer that degraded FET performance.

Other efforts have included the growth of an AlGaAs/GaAs HBT on top of a High Electron Mobility Transistor (HEMT) in a single growth process. This process merged a FET into the collector of the HBT through a single epitaxial growth with only limited success because of poor performance characteristics.

A number of other attempts have been made to integrate InGaP/GaAs HBTs with MESFET and HEMT structures. In these attempts, an InGaP layer was used as the channel for the FET devices. However, the channel had low mobility and saturation velocity with high linear resistance and poor high frequency performance.

The first step in the manufacturing of such an integrated device is the production of an appropriate epitaxial wafer having the semiconductor structure from which devices can be fabricated by lithographic processes.

Accordingly, a need exists for a method of manufacture of an epitaxial wafer which would allow the suitable integration of HBT and FET devices on a single compound substrate selected from Group III-V materials.

BRIEF DESCRIPTION OF THE DRAWINGS

FIG. 1 is a table indicating the epitaxial layer sequence for an HBT-MESFET structure.

FIG. 5 is a table indicating the epitaxial layer sequence for an HBT-PHEMT structure.

SUMMARY

Figure 2:
FIG. 2 depicts a substrate used for fabricating an integrated III-V semiconductor device in accordance with an illustrated embodiment of the invention.

The present application relates to manufacturing epitaxial wafers suitable for the fabrication of integrated devices and circuits on a common compound semiconductor III-V wafer. As used herein, an epitaxial wafer includes a sequence of epitaxially grown layers on a semiconductor substrate. The various layers typically are lattice-matched and can be selected for their particular physical and electrical characteristics. In some cases, the epitaxial wafer also may include one or more metamorphic or other layers.

In one aspect, a method includes providing a III-V semiconductor substrate and performing an in-situ substrate cleaning process to reduce the presence of contaminants on the substrate. Subsequently, at least two epitaxial structures, adapted for subsequent fabrication into two different types of devices on a common substrate, are grown on the substrate.

Another aspect relates to a method of fabricating an integrated III-V semiconductor structure in a reactor. The method includes providing a first III-V semiconductor substrate in the reactor, growing at least two epitaxial structures for different types of devices on the first substrate while the first substrate is in the reactor, and removing the first substrate from the reactor. Inner surfaces of the reactor are coated to reduce the release of contaminants from those surfaces during subsequent process steps. The method also includes subsequently providing a second III-V semiconductor substrate in the reactor and growing at least two epitaxial structures for different types of devices on the second substrate while the second substrate is in the reactor.

According to another aspect, a semiconductor structure includes a substrate, a first epitaxial structure disposed on top of the substrate, and a second epitaxial structure disposed on top of the first epitaxial structure. An interface between the substrate and the first epitaxial structure is substantially free of contaminants.

A further aspect relates to a method of fabricating an epitaxial structure for fabricating an integrated pair of GaAs-based HBT and FET devices. The method includes growing a first set of epitaxial layers that forms a portion of the FET device on a semi-insulating GaAs substrate. A GaAs layer is grown over the first set of epitaxial layers to serve as a cap layer for the FET device and a subcollector layer for the HBT device. The method includes growing a second set of epitaxial layers over the GaAs layer. The second set of epitaxial layers forms a portion of the HBT device.

Some implementations may include one or more of the following features and advantages.

For example, the epitaxial process may enable growth of FET and HBT devices as combined structures on a single substrate.

The process may enable production (high volume, successive epitaxial growth runs) of FET/HBT structures that accommodate the conflicting requirements of each specific device type and device epitaxial parameters or constraints.

The process may enable incorporation of selective etch stops, either wet or dry, to selectively contact key layers within each device type.

The process may incorporate sacrificial "lift-off" layers that can be fully removed to eradicate one or either device type during subsequent device processing.

The process may, or may not, be a single continuous epitaxial deposition process.

The process may realize sharp, well defined interfaces and exhibit sufficient layer thickness control so that the FET may be implemented as a Pseudomorphic High Electron Mobility Transistor (PHEMT) device using epitaxially strained layers and/or delta doping techniques.

The process need not require any specific functionally shared layers between the HBT and the PHEMT.

The process may be employed for both planar and non-planar substrates to enable subsequent beneficial processing morphology.

In some implementations, the process is sufficient to achieve a highly resistive buffer for sufficient device isolation (DC and RF) within the environment generated by HBT epitaxial deposition. The process may include ex-situ or in-situ substrate preparation, control over the resistivity of buffer layers and buffer layer sequences.

The process may achieve highly doped contact layers for HBT emitters and HBT bases.

The process may be preferentially implemented in a rotating disk reactor (RDR) MOCVD process but also may be used for alternate MOCVD or MBE techniques.

The process may be used with GaAs, InP and related Group III-V compounds.

The process may encompass any specific HBT/BJT implementation (e.g., InGaP, AlGaAs emitter, GaAs, InGaAs, InGaAsN base).

Other features and advantages will be readily apparent from the following detailed description, the accompanying drawings and the claims.

DETAILED DESCRIPTION OF ILLUSTRATED EMBODIMENTS

A process for fabricating an integrated III-V semiconductor device is usually divided into two distinct technological processes often performed by two different entities in the semiconductor industry. The first is to produce a semiconductor wafer having a sequence of epitaxial layers with the desired physical and electrical properties. The second is to process such a wafer lithographically so that the device topology and interconnections between devices are defined, followed by dicing the wafer into discrete integrated circuit chips (ICs), and packaging such ICs into an encapsulated package, lead frame, or other type of package so that they may be mounted on a printed circuit board.

The present invention is directed to the first such technological process-manufacturing an epitaxial wafer, and the epitaxial semiconductor structure formed by such a process. In particular, the present invention includes providing and preparing a substrate, and growing an appropriate sequence of epitaxial layers on the substrate. In an aspect of the invention, the epitaxial layers are designed and specified so that following subsequent lithographic device definition, etching, and subsequent processing, different types of active devices will be formed on the common group III-V wafer.

In a specific example, a heterojunction bipolar transistor (HBT) and field effect transistor (FET) may be fabricated on the same substrate. In one embodiment, the HBT is fabricated first. Once the HBT has been fabricated, a passivation layer may be formed or deposited by standard semiconductor fabrication techniques over the HBT to protect the HBT. Once the passivation layer has been deposited over the HBT, the FET may be fabricated. In an alternative embodiment (to be described next), the process is reversed.

Details of a particular example for an integrated HBT-MESFET structure on a single substrate are provided in the table of FIG. 1. According to that example, various epitaxial layers are grown sequentially on a semiconductor substrate 10 (FIG. 2). The columns in the table of FIG. 1 indicate, respectively, the function of each layer, as well as the nominal thickness in angstroms (Å), the mole fraction and the carrier concentration (per $cm^3$) for each layer in the particular implementation. In other implementations, those values may vary. In addition, other substrates and layers may be provided, and different types of devices may be formed in the resulting structure.

The substrate 10 can be based upon any Group III-V material (e.g., preferably a semi-insulating GaAs substrate). The set of epitaxial layers can be grown on the substrate using any known technique (e.g., VPE, MOCVD or MBE).

In one aspect of the invention, a low leakage buffer layer can be provided as a first step in creating a first epitaxial structure. The buffer layer may include, for example, one or more layers of undoped GaAs or AlGaAs layers. The particular buffer layer in the example of FIG. 1 has two sub-layers: an undoped GaAs layer on an undoped AlGaAs layer. The buffer layer can help initiate crystal growth and can provide the required pinch-off features of the FET. The buffer layer also can help trap unwanted and residual, electronically active impurities and provide electrical isolation for the subsequently formed devices. The buffer layer is particularly important for enabling the proper operation of FETs that are integrated on a common substrate with HBTs.

Figure 3:
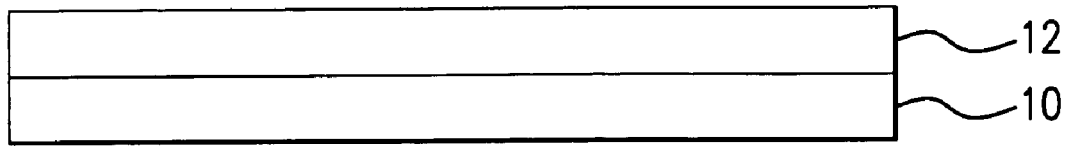
FIG. 3 depicts of substrate of FIG. 2 with a first epitaxial structure fabricated onto an upper surface.

Next, a first epitaxial structure 12 for the FET may be grown (FIG. 3) over the substrate. The FET structure 12 may include, for example, a 50 nanometer (nm) thick undoped GaAs spacer layer and a doped GaAs channel layer of about 150 nm thickness. The channel layer may be doped, for example, with an n-type dopant having a doping concentration of about $2.0 \times 10^{17}$ $cm^{-3}$. The first epitaxial structure 12 also may include additional layers, such as an InGaP stop-etch layer and a GaAs contact layer for the FET.

Figure 4:
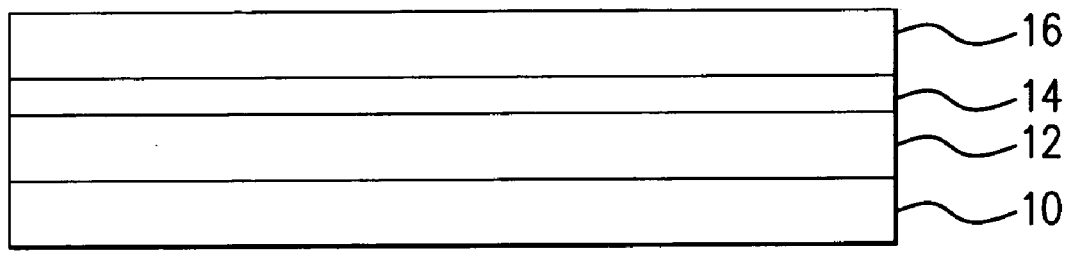
FIG. 4 depicts the substrate of FIG. 3 with second and third epitaxial structures fabricated onto the upper surface.

A separation layer or stop-etch layer may be disposed over the FET layers as part of a second epitaxial structure 14. Alternatively, or in addition, a contact layer may be disposed over the first epitaxial structure 12 as part of the second epitaxial structure 14 (FIG. 4). The contact layer serves as the subcollector for the HBT device as well as a cap layer for the FET.

Although the particular example discussed here includes a layer that is intended to be common to both the FET(s) and HBT(s), in other implementations the different types of devices can be formed in different layers such that they do not share a layer in common. Forming the different types of devices in different layers allows the electrical or other characteristics of the devices to be tuned independently and can provide greater flexibility in their design.

Next, in the particular example of FIG. 1, the other HBT layers can be grown over the contact layer as a third epitaxial structure 16. First, lightly doped n-type GaAs collector layers of about 1,000 nm may be grown, followed by a p-type GaAs base layer of about 100 nm. The GaAs layer may be doped, for example, with carbon to a level of about $4.0 \times 10^{19}$ cm$^{-3}$. An InGaP emitter layer of about 50 nm doped with silicon to a level of about $3.0 \times 10^{17}$ cm$^{-3}$ can be grown over the base layer.

Structures with multiple epitaxially grown structures also can be processed to form other types of integrated active devices. For example, a first epitaxial structure can provide the layers for a PHEMT and a second epitaxial structure can provide the layers for a HBT. Details of a particular example for an integrated HBT-PHEMT structure on a single substrate are provided in the table of FIG. 5.

Device characteristics and performance can be adversely impacted, for example, by the presence of surface contaminants at the interface between the substrate 10 and the first epitaxial structure 12. Examples of contaminants include silicon (e.g., resulting from polishing the GaAs substrate), tellurium (e.g., from previous wafer runs in which tellurium-doped InGaAs epi-layers are grown), or excessive levels of $O_2$. Such contaminants can adversely impact the performance of FETs such as PHEMTs. Also, excessively aggressive etching techniques (e.g., temperatures or flow rates that are too high) can cause mass transport from exposed reactor surface deposits to the substrate. The consequence of such mass transport is formation of conductive paths at the substrate-epi layer interface or increased substrate surface roughness or both, resulting in poor device performance (e.g., sub-threshold leakage) and poor isolation between devices on the same chip.

According to an aspect of the invention, in order to reduce the amount of contaminants that may be present at the substrate-epi interface, an in-situ substrate cleaning process can be performed. The cleaning process, an example of which is described in greater detail below, can be used to process wafers in a MOCVD reactor in which a platter is used to hold the wafers being processed. The cleaning process also can be used in other wafer processing equipment.

Preferably, the in-situ cleaning process is performed before growing epitaxial layers on the substrate 10 and can facilitate back-to-back wafer processing runs. The cleaning process can help remove the native contamination from the substrate while not inducing mass transport from the reactor deposits to the substrate. Thus, the cleaning process can result in a clean substrate-epilayer interface that provides good device isolation.

Figure 6:
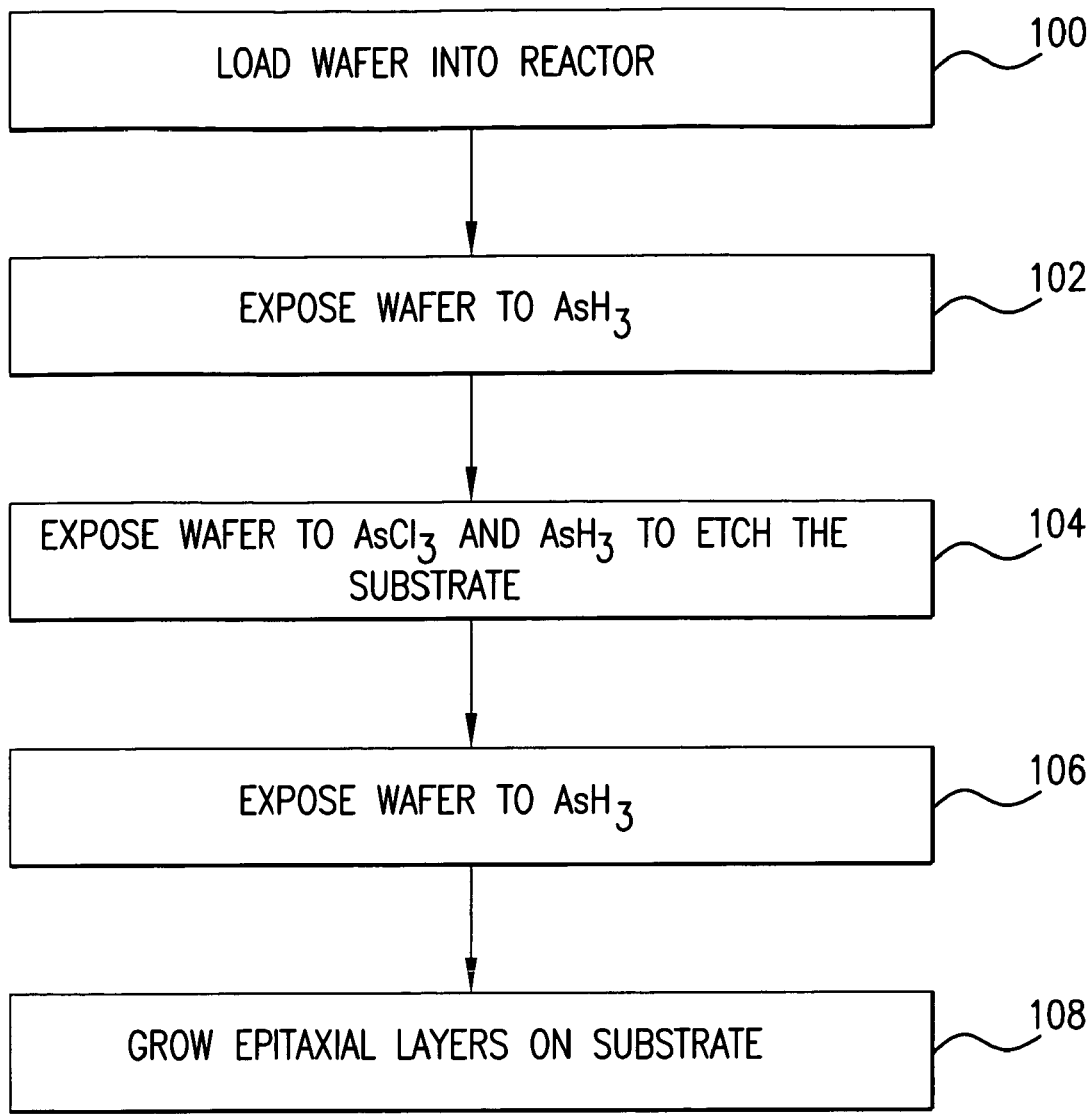
FIG. 6 is a flow chart of a fabrication process that includes in-situ substrate cleaning in accordance with an embodiment of the invention.

According to a particular implementation illustrated in FIG. 6, a wafer is loaded into the reactor (block 100). The cleaning process exposes the GaAs substrate to a halide-based etchant (e.g., HCl, $Cl_2$, $AsCl_3$, $PCL_2$, $AsBr_2$), in combination with atomic hydrogen. In a particular implementation, a chlorine-based etchant such as $AsCl_3$ is used. In that case, the substrate can be exposed, for example, to $AsCl_3$ and $AsH_3$ at an elevated temperature (e.g., in the range 400-800° C. The cleaning process includes an $AsH_3$ exposure step (block 102), an $AsCl_3$ and $AsH_3$ exposure step for etching the substrate (block 104), followed by an $AsH_3$-only exposure for surface morphology recovery (block 106). In this example, the atomic hydrogen is obtained from the decomposed $AsH_3$. After performing the in-situ substrate cleaning process, the various epitaxial layers can be grown (block 108).

For particular implementations in which multiple wafers are processed in a high-speed, rotating disk reactor, a temperature in the range of about 600-700° C. can be advantageous for the substrate cleaning process. At higher temperatures, tellurium may be released from layers in previous wafer processing runs. Suitable pressures are in the range of 10 Torr to atmospheric pressure, although a range of about 50-80 Torr is particularly well-suited for some applications. The exposure to the etchant should be long enough to clean the surface without excessively damaging the surface morphology. In some cases, an exposure time of about fifteen seconds to several minutes at a flow rate of about 100 cc$^3$ can be used at appropriate pressure and temperature. The foregoing factors may vary from reactor to reactor and may vary depending on the configuration of the platter that holds the wafers. Thus, in general, the exposure time, flow rate, pressure and temperature for the cleaning process can be adjusted depending on the particular geometry, composition and thickness of the wafer to achieve desired device performance.

Figure 7A:
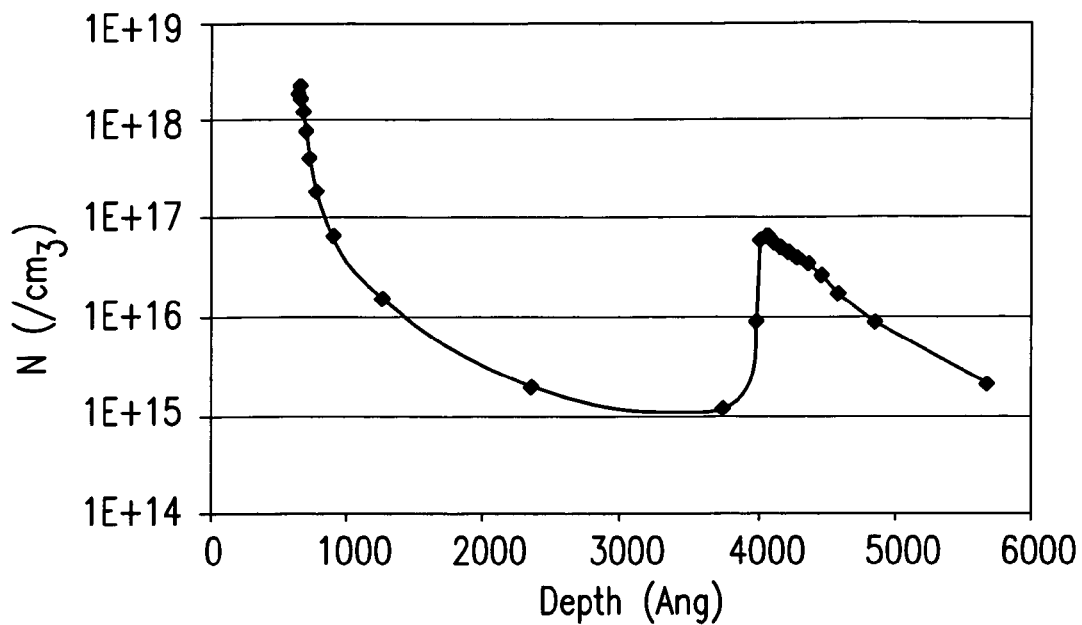
FIG. 7A is a graph showing the doping depth profile of a PHEMT-type epitaxial structure for which the in-situ substrate cleaning process was not performed.
Figure 7B:
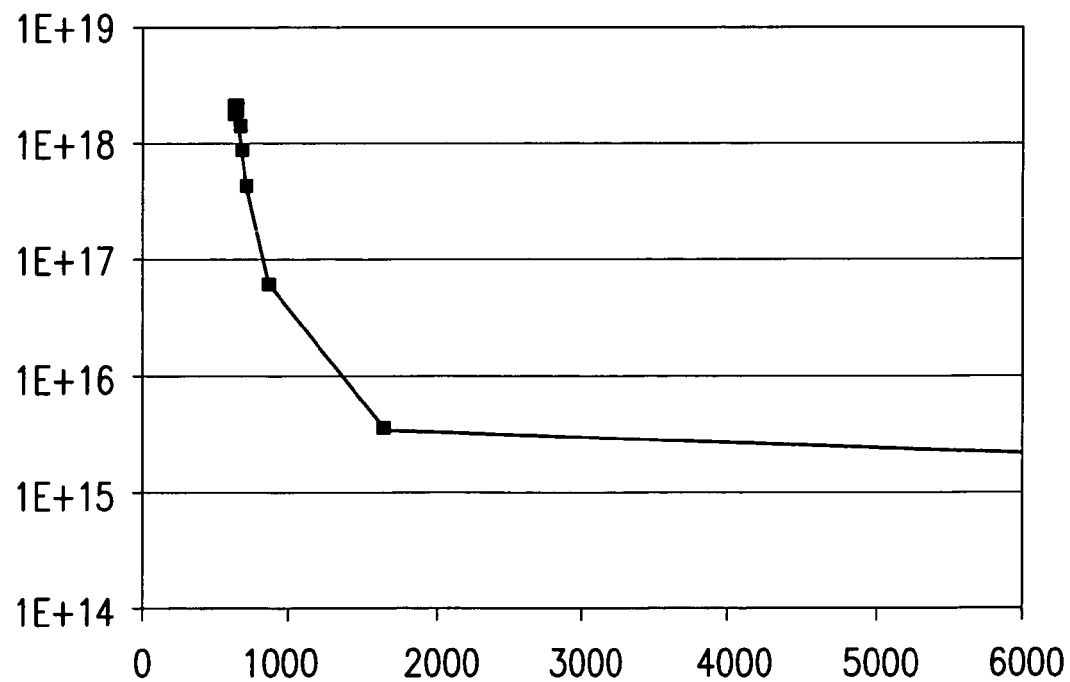
FIG. 7B is a graph showing the doping depth profile of a PHEMT-type epitaxial structure for which an in-situ substrate cleaning process was performed.

FIGS. 7A and 7B are graphs showing the doping profile of a PHEMT-type epitaxial structures. The horizontal axis indicates depth in angstroms, where the origin ("0") corresponds to the top surface an AlGaAs barrier layer. The peak doping concentration (which in the illustrated example is somewhat greater than 1E+18 cm$^{-3}$) corresponds to the InGaAs channel.

FIG. 7A shows the doping profile of a PHEMT-type epitaxial structure for which the in-situ chlorine-based substrate cleaning process was not performed. A peak in the doping profile appears at a depth of about 4,000 angstroms, which corresponds to the interface between the GaAs buffer layer and the GaAs substrate. Such a peak, which indicates the presence of charge resulting from contaminants at the buffer-substrate interface, is undesirable and can adversely impact FET device operation and isolation between devices. The in-situ substrate cleaning process can result in a dopant concentration at the interface of the substrate and the epitaxial structure that is between ten and hundred times less than it would be in the absence of the in-situ cleaning process.

FIG. 7B show the doping profile of a PHEMT-type epitaxial structure for which an in-situ chlorine-based substrate cleaning process was performed. As can be seen, the doping profile beyond a depth of about 1,500 angstroms continuously decreases with no additional peaks, indicating a significant reduction in the contaminants present at the buffer-substrate interface.

According to another aspect of the invention, in implementations using an MOCVD or other chamber in which semiconductor wafers are processed, it may be desirable to seal exposed surfaces of the reactor between wafer processing runs so as to reduce the release of contaminants from those surfaces during subsequent growth steps. Examples of reactor surfaces from which contaminants may be released include, but are not limited to, the reactor liner, the walls and ceiling of the reactor, the spindle, probes and screens, as well as a platter that holds the semiconductor wafers. The release of contaminants from such surfaces can be particularly problematic for FET-layers formed during a wafer processing run that follows a previous wafer processing run in which layers for HBT devices were formed.

Figure 8:
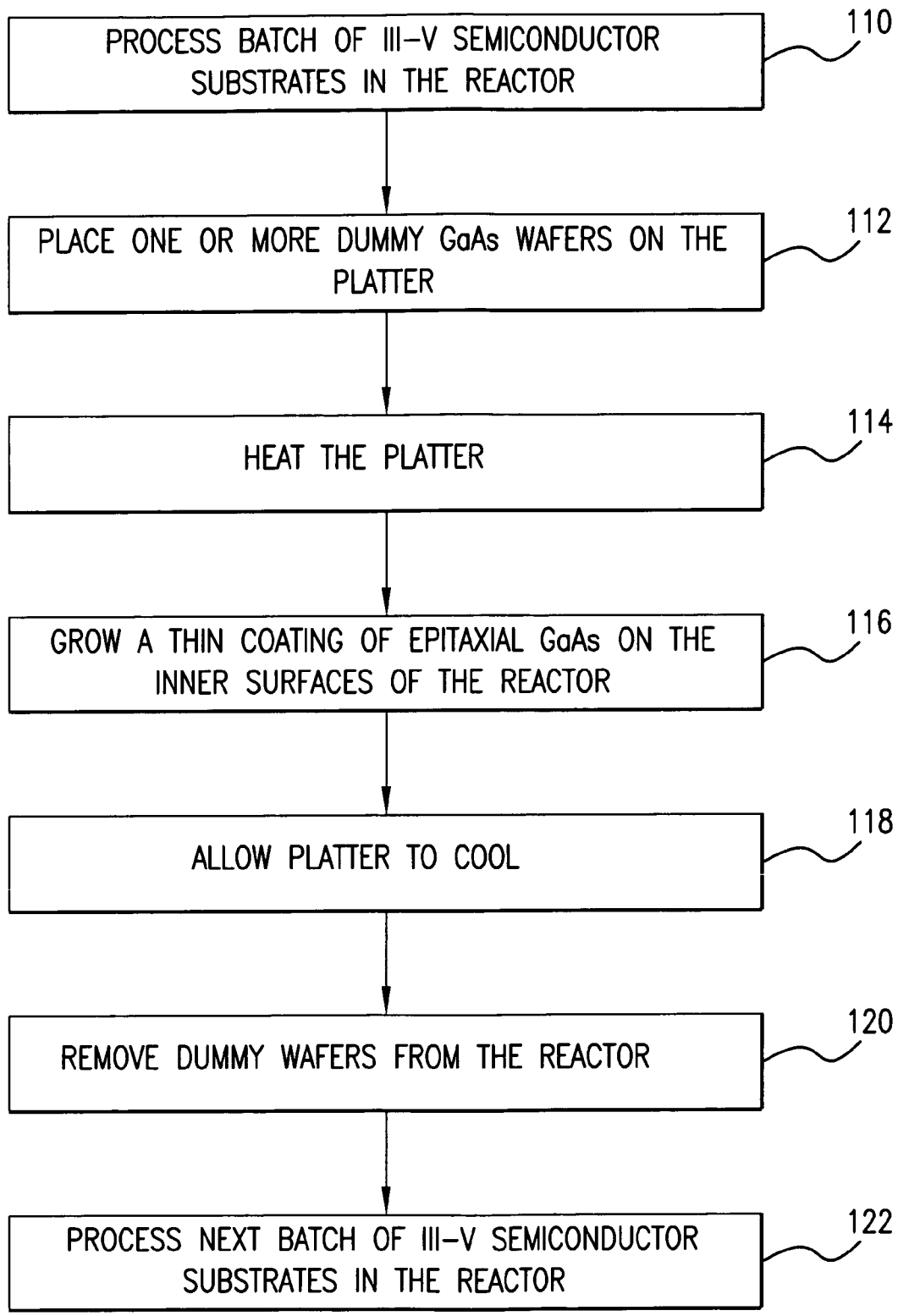
FIG. 8 is a flow chart of a wafer processing cycle that includes a chamber pre-conditioning process according to an embodiment of the invention.

As illustrated by FIG. 8, a first wafer processing run is performed (block 110). The wafer processing run may include, among other steps, loading semiconductor substrates (i.e., wafers) into the reactor, growing one or more epitaxial layers on the substrates and removing the substrates from the reactor. Before starting the next wafer processing run, the chamber pre-conditioning process is performed. In the illustrated implementation, the chamber pre-conditioning process includes placing one or more dummy GaAs (or other compound III-V semiconductor) wafers on the platter to cover the pockets in the platter (block 112), heating the platter to an elevated temperature (e.g., about 650° C. (block 114), and epitaxially growing a thin coating of GaAs (or other compound III-V semiconductor) on the inner surfaces of the reactor (block 116). Preferably, the coating should cover at least the reactor liner, the walls and ceiling of the reactor, the spindle, probes and screens, as well as the platter that holds the semiconductor wafers. Other inner surfaces may be coated as well. Such a thin coating (i.e., less than about 3 microns (μm)) can encapsulate any contaminants, such as tellurium, that may be present on the inner surfaces of the reactor. For some implementations, a coating having a thickness of about 0.25 μm is sufficient. Preferably, the sealing process should be performed as quickly as possible to reduce the overall manufacturing cycle time. In a particular implementation, the process can be completed in less than about five minutes. After growing the coating, the platter is cooled (block 118), and the dummy wafers are removed from the reactor (block 120). A new batch of III-V semiconductor substrates then can be processed in the reactor (block 122).

It is desirable to cover the pockets of the platter with dummy wafers (e.g., GaAs or silicon) during the chamber pre-conditioning process so as to increase the useful lifetime of the platter. However, the chamber pre-conditioning process can be performed without covering the pockets.

For fabrication processes in which both the in-situ substrate cleaning process and the chamber pre-conditioning process are performed, the substrate cleaning process can be performed more aggressively, for example by using higher temperatures (e.g., 700-800° C.). The higher temperatures can allow any in-situ thermal or chemical cleaning process to be performed more quickly without risk that contaminants on the platter will be transferred to the surface of the substrate. Performing such processes more quickly can result in shorter manufacturing cycles.

The foregoing substrate cleaning process and chamber pre-conditioning process can be particularly useful when fabricating an integrated III-V semiconductor structure with epitaxial structures that include at least two different types of active devices. Reducing the contaminants at the substrate-epitaxial layer interface, and possibly at other interfaces as well, can significantly improve device performance.

Figure 9:
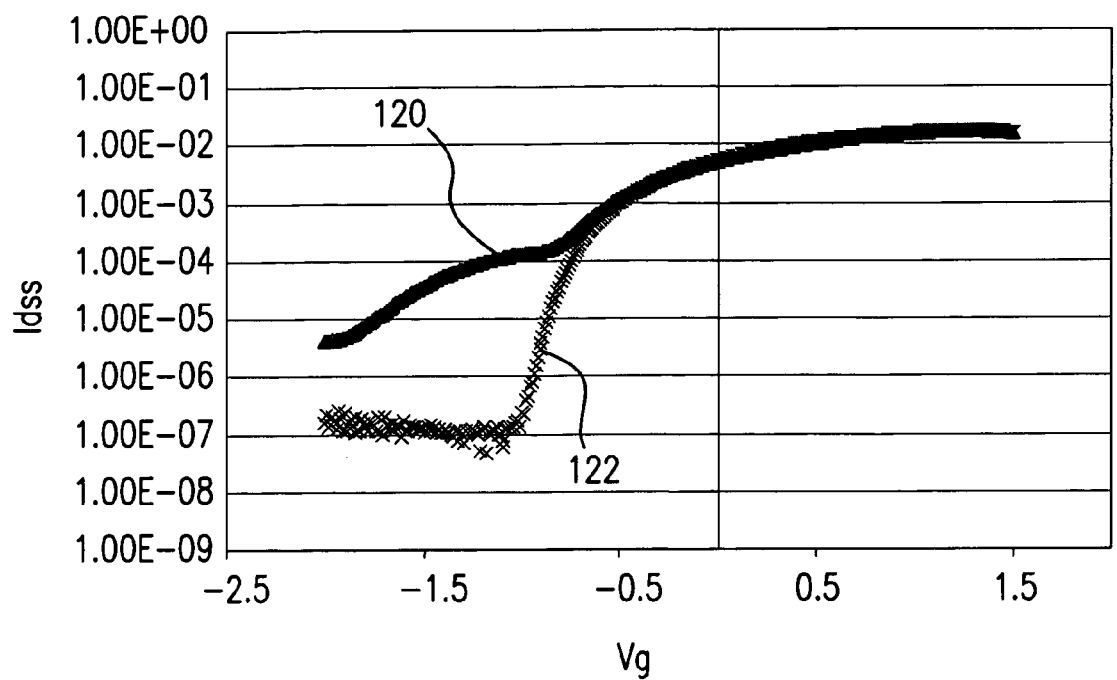
FIG. 9 is a graph comparing the sub-threshold leakage for PHEMT-type devices fabricated on epitaxial structures with and without the chamber pre-conditioning process.

FIG. 9 illustrates voltage-versus-current curves for PHEMT-type devices in an epitaxial structure. The measurements were obtained using a mercury probe. The curve 120 corresponds to a device fabricated in an epitaxial structure which was grown without performing the in-situ substrate cleaning process and the chamber pre-conditioning process. As can be seen from the curves, the device exhibited significant sub-threshold current leakage. In contrast, the curve 122 corresponds to a device fabricated in an epitaxial structure which was grown after performing the chamber pre-conditioning process and the in-situ substrate cleaning process. The curve 122 indicates a significant reduction in sub-threshold current leakage.

Other implementations are within the scope of the claims. What is claimed is:

1. A method of fabricating an integrated III-V semiconductor structure in a reactor, the method comprising:
   providing a first III-V semiconductor substrate in the reactor;
   growing at least two epitaxial structures for different types of devices on the first substrate while the first substrate is in the reactor;
   removing the first substrate from the reactor;
   coating inner surfaces of the reactor to reduce the release of contaminants from those surfaces during subsequent process steps;
   subsequently providing a second III-V semiconductor substrate in the reactor; and
   growing at least two epitaxial structures for different types of devices on the second substrate while the second substrate is in the reactor.

2. The method of claim 1 wherein the coating comprises substantially the same material as the III-V semiconductor substrate.

3. The method of claim 2 wherein the coating is grown on the inner surfaces of the reactor in polycrystalline form.

4. The method of claim 2 wherein the coating comprises GaAs.

5. The method of claim 2 wherein the coating has a thickness of less than about 3 μm.

6. The method of claim 1 wherein coating a surface of the platter includes:
   placing a semiconductor wafer on a platter in the reactor;
   heating the platter;
   growing an epitaxial layer to coat the inner surfaces of the reactor; and
   removing the semiconductor wafer from the reactor.

7. A method of fabricating an integrated III-V semiconductor structure in a reactor in which a platter is used to hold wafers being processed, the method comprising:
   coating a surface of the platter to reduce the release of contaminants from the platter surface during subsequent growth steps;
   providing a III-V semiconductor substrate on the platter; and
   growing at least two epitaxial structures for different types of devices on the substrate while the substrate is on the platter.

8. The method of claim 7 wherein the coating comprises substantially the same material as the III-V semiconductor substrate.

9. The method of claim 7 wherein the coating is grown on the platter in polycrystalline form.

10. The method of claim 7 wherein the coating comprises GaAs.

11. The method of claim 7 wherein the coating has a thickness of less than about 3 μm.

12. The method of claim 7 wherein coating a surface of the platter is performed between successive III-V semiconductor substrate processing runs.

13. The method of claim 7 wherein coating a surface of the platter includes:
   placing at least one wafer on the platter;
   heating the platter;
   growing an epitaxial layer to coat the surface of the platter; and
   removing the at least one wafer from the reactor.

* * * * *